United States Patent
Zarubinsky et al.

(12) 
(10) Patent No.: US 6,380,811 B1
(45) Date of Patent: Apr. 30, 2002

(54) SIGNAL GENERATOR, AND METHOD

(75) Inventors: Michael Zarubinsky, Jerusalem; Konstantin Berman, Haifa; Eliav Zipper, Ramat Gan, all of (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/784,279

(22) Filed: Feb. 16, 2001

(51) Int. Cl.$^7$ .................................................. H03L 7/06
(52) U.S. Cl. ........................... 331/18; 331/1 A; 331/16; 327/156; 327/291; 327/299
(58) Field of Search ........................... 331/1 A, 16, 18, 331/25; 327/156–159, 291, 299

(56) References Cited

U.S. PATENT DOCUMENTS

| | | | |
|---|---|---|---|
| 5,150,386 A | * | 9/1992 | Stern et al. .................. 375/118 |
| 5,774,006 A | | 6/1998 | Barel et al. .................. 327/291 |
| 5,832,048 A | | 11/1998 | Woodman, Jr. ............. 375/376 |

OTHER PUBLICATIONS

Ronald E. Crochiere, Lawrence R. Rabiner; "Interpolation and Decimation of Digital Signals—A Tutorial Review"; Proceedings of the IEEE, vol.69, No. 3, Mar. 1981; pp. 417–447.

* cited by examiner

*Primary Examiner*—David Mis (57) ABSTRACT

A signal generator (100) receives an input clock signal ($X_1$) at a first frequency ($F_1$) and derives an output clock signal (Y) at a second frequency ($F_Y$). An arrangement (110) using a first intermediate signal (Z) receives the input clock signal ($X_1$) and provides a second intermediate signal ($X_2$) by selectively providing transitions (119) of the second intermediate signal ($X_2$) at time intervals ($T_2(n)$) that are determined by a variable number ($A+P(n)$) of periods ($T_Z$) of the first intermediate signal (Z). The second intermediate signal ($X_2$) has a frequency ($F_2$) that is in average ($F'_2$) higher than the first frequency ($F_1$). A phase-looked loop (PLL) circuit (180) locks at this average frequency ($F'_2$) and provides the output clock signal (Y).

18 Claims, 5 Drawing Sheets

-PRIOR ART-

SIGNAL GENERATOR, AND METHOD

FIELD OF THE INVENTION

The present invention generally relates to an arrangement that generates periodic electrical signals, and more particularly, to a signal generator for a microprocessor, and to a method.

BACKGROUND OF THE INVENTION

Many applications, such as microprocessors, require a clock having a high frequency. While quartz oscillators operate at a lower frequency, conversion is often required.

Figure 1:
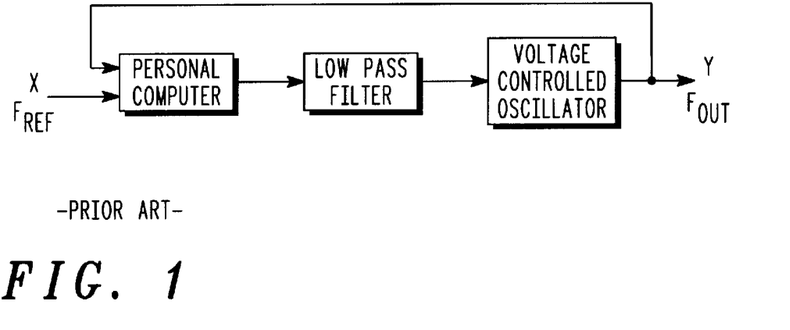
FIG. 1 illustrates a simplified block diagram of a phase-locked loop (PLL) circuit.

FIG. 1 illustrates a simplified block diagram of a phase-locked loop (PLL) circuit. The PLL circuit has a phase comparator (PC), a low pass filter (LPF) with capacitor, and a voltage controlled oscillator (VCO). The PLL circuit provides that the frequency $F_{OUT}$ of the output signal Y remains locked to the frequency $F_{REF}$ of the input signal X (or to a multiple of $F_{REF}$). The phase comparator detects phase differences between the input signal X and the output signal Y and acts on the VCO to minimize the difference.

It is desired to integrate the complete PLL circuit and the processor into a monolithic integrated chip. For many "on-chip" applications, the input signal X has a low reference frequency (e.g., $F_{REF} \approx 32$ kHz) and the output signal Y has a very high output frequency (e.g., $F_{OUT} \approx 100 \ldots 200$ MHz). Frequency multiplication is required by a factor $F_{OUT}/F_{REF}$ of about $3000 \ldots 6000$. Since noise influence increases frequency variations, the PLL circuit would require a large capacitor (e.g., 10 nF) external to the chip and connected by an unwanted extra pin. Integrating the capacitor would be difficult too; for example, the silicon area of such a capacitor would be larger than the area of the PLL circuit itself.

There in an ongoing need to provide an improved PLL circuit as well as a method that mitigate some or all of these and other disadvantages and limitations of the prior art.

DETAILED DESCRIPTION OF THE DRAWINGS

The following description of a preferred embodiment follows the order (a) short introduction into the signals, (b) explanation of components, (c) detailed explanation of the signals, and (d) method of operation.

(a)

When referring to signals, terms like "intermediate", "clock", "input", "output" are introduced once but can conveniently be left out later. For convenience, same symbols (e.g., symbol "dK") are used for the signals (e.g., "signal dK") and any numeric value that the signal represent (e.g., "integer dK").

Figure 2:
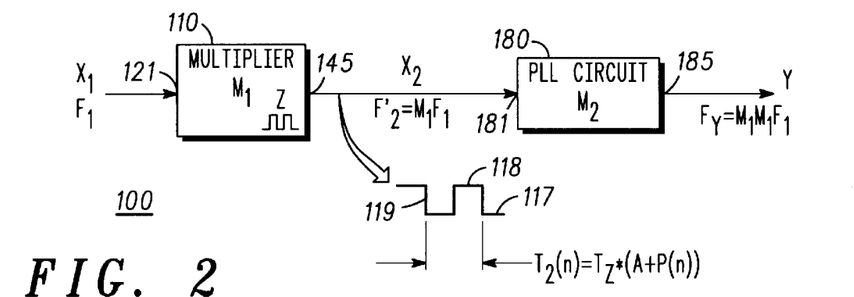
FIG. 2 illustrates a simplified block diagram of a signal generator according to the present invention.

For convenience and simplicity, signals $X_1$, $X_2$, $X_3$, Z are considered to be digital single-bit signals of rectangular shape, cf. signal $X_2$ in FIG. 2 as representative example. First logical state "1" and second logical states "0" are defined, for example, by high value 118 and low value 117, respectively, of a physical quantity, such as a voltage or a current. The duration of both logical states is conveniently assumed to be substantially equal. Neglected is the transition time between the states, i.e., from "1" to "0" and vice versa. For convenience, a period T is conveniently defined between consecutive transitions from "1" to "0" ("falling edges"). The period T is the reciprocal of a frequency of the signal, that is $$T = 1/F \qquad (2)$$

Signals such as dK and K are considered to be multi-bit signals that represent a positive or negative numerical value. Periods are conveniently defined between time points that allow changes in the numerical value.

(b)

FIG. 2 illustrates a simplified block diagram of signal generator 100 according to the present invention. Signal generator 100 comprises digital frequency multiplier 110 ("arrangement", "multiplier") and PLL circuit 180. It is an advantage of the present invention that generator 100 is implemented on a single monolithic chip.

Generator 100 receives external input clock signal $X_1$ having frequency $F_1$ (e.g., $F_1 \approx 32$ kHz) at input 121. An example for $X_1$ is explained in connection with FIG. 8. The period $T_1$ of signal is defined as $$T_1 = 1/F_1 \qquad (4)$$

$$T_1 = 31.25 \ \mu s \ (\text{example}) \qquad (6)$$

Since signal $X_1$ is, preferably, provided by a quartz oscillator (not shown), frequency variations of $F_1$ are neglected.

Generator 100 provides output clock signal Y having frequency $F_Y$ at output 185. $F_Y$ is larger than $F_1$ (e.g., $F_Y \approx 100$ MHz). The frequency jitter of signal Y (variations of $F_Y$ over the time) are, preferably, in the range of plus/minus one per cent (minimum 99 MHz, maximum 101 MHz).

Multiplier 110 uses intermediate clock signal Z having frequency $F_Z$. The period $T_Z$ of signal Z is defined as:

$$T_Z = 1/F_Z \qquad (8)$$

Details for signal Z are explained in connection with FIG. 8.

Multiplier 110 receives signal $X_1$ and provides intermediate clock signal $X_2$ having frequency $F_2$ at output 145. Details for signal $X_2$ are explained in connection with FIG. 11. The period $T_2(n)$ of signal $X_2$ is defined as the time interval two consecutive falling edges 119.

Multiplier 110 selectively provides transitions of signal $X_2$ (e.g., falling edges 119) at consecutive time intervals $T_2(n)$; the duration of $T_2(n)$ is determined by a variable number (e.g., A+P(n)) of periods $T_Z$ of signal Z. Details for multiplier 110 are explained in connection with FIG. 3.

The time average $F'_2$ of frequency $F_2$ is substantially constant, in other words, measuring $F_2$ at consecutive time points and calculating the arithmetic average of the measurements substantially results to one and the same $F'_2$. Average $F'_2$ is higher than $F_1$ but lower than $F_Y$, that is:

$$F'_2 > F_1 \qquad (10)$$

$$F'_2 < F_Y \qquad (12)$$

Average $F'_2$ is related to $F_1$ by multiplication factor $M_1$, that is:

$$F'_2 = M_1 * F_1 \qquad (14)$$

Conveniently, factor $M_1$ is an integer; preferred values for factor $M_1$ are in the range between 128 and 1024 (powers to 2); in the example, $M_1 = 512$. Preferably, factor $M_1$ is programmable, so that generator 100 operates with either value.

To simplify calculations and further explanation, $M_1$ is assumed to be $M_1 = 500$ (instead of 512), thus resulting in average $F'_2 = 16$ MHz and an average period $T'_2 = 1/F'_2 = 0,0625$ ns.

PLL circuit 180 receives signal $X_2$ (at input 181) as reference to lock and provides signal Y at output 185; frequency $F_Y$ is related to average $F'_2$ by multiplication factor $M_2$, that is:

$$F_Y = M_2 * F'_2 \qquad (16)$$

$$F_Y = M_1 * M_2 * F_1 \qquad (18)$$

Conveniently, factor $M_2$ is a real number.

In the illustrative example with $F_Y = 100$ MHz and $F'_2 = 16$ MHz, factor $M_2$ is 6.25.

Figure 7:
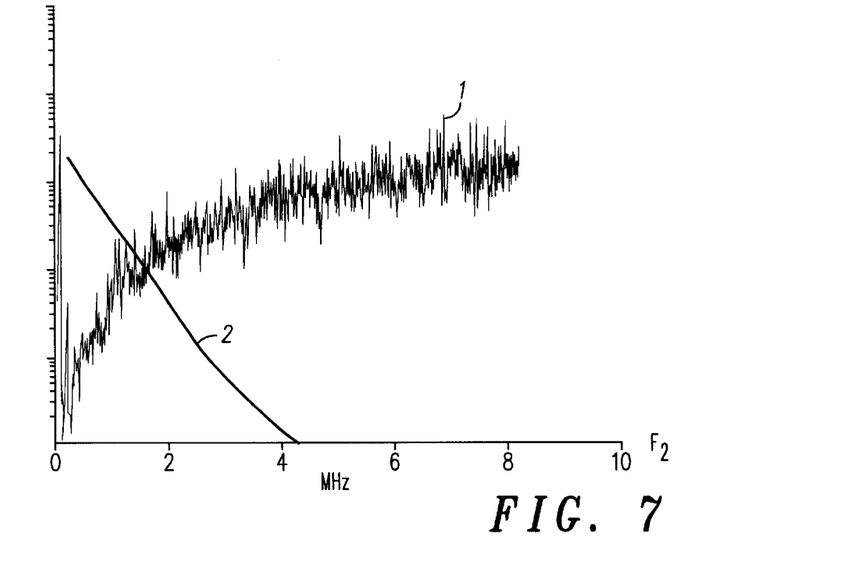
FIG. 7 illustrates a simplified spectrum of an intermediate signal in the generator of FIG. 2, as well as illustrates a transfer function.

PLL circuit 180 low-pass filters out frequency fluctuations of signal $X_2$ (transfer function, cf. FIG. 7). The frequency jitter of signal Y is less than the jitter of signal $X_2$.

Figure 3:
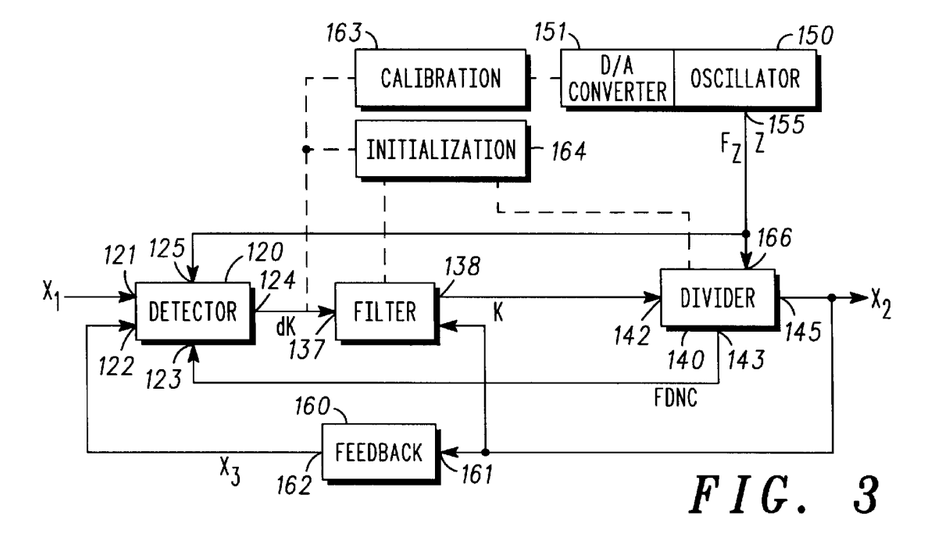
FIG. 3 illustrates a simplified block diagram of a multiplier in the generator of FIG. 2.

FIG. 3 illustrates a simplified block diagram of multiplier 110 in the generator of FIG. 2. Multiplier 110 looks similar to a conventional PLL with digital components, however, its operation and its signals are different.

In a core portion, multiplier 110 comprises digital phase detector 120 ("detector"), digital filter 130 ("filter", details in FIG. 5), fractional divider 140 ("divider", details in FIG. 6), local oscillator 150 ("oscillator"); and feedback unit 160.

Filter 130 and divider 140 has registers or other memory means (no shown in FIG. 3) to store numeric values needed for operation, such as, for example, filter coefficients, and look-up tables. Persons of skill in the art can implement the registers without the need of further explanation herein. Oscillator 150 has digital-to-analog converter 151 ("DAC"). Signal lines with in the core portion are illustrated by plain lines.

Preferably, to assist operation, multiplier 110 further comprises calibration unit 163, and initialization unit 164. For convenience, signal lines to and from units 163, 164 are illustrated by dashed lines.

In the core portion (120, 130, 140, 150, 160), signals are distributed as follows: $X_1$ (cf. FIG. 2, input 121 of detector 120), dK (output 124 of detector 120 to input 137 of filter 130), K (output 138 of filter 130 to input 142 of divider 140), $X_2$ (output 145 of divider 140 to input 161 of feedback unit 160), $X_3$ (output 162 of feedback unit 160 to input 122 of detector 120), correction signal for frequency divider noise correction (FDNC, output 143 of divider 140 to input 123 of detector 120), Z (output 155 of oscillator 150 to input 146 of divider 140 and to input 125 of detector 120).

In a first control loop (detector 120, filter 130, divider 140, feedback unit 160), signal $X_2$ is derived from signal $X_1$, wherein signal Z serves as an auxiliary signal. Preferably, this first control loop has two signal feedback paths:

(i) the path via feedback unit 160 to alter K in a coarse manner; and—optionally—

(ii) the direct path from divider 140 to detector 120 for fine adjusting the operation of detector 120 using FDNC (real number, details later).

In a second control loop, calibration unit 163 compensates the influence of the environment temperature on oscillator 150.

Oscillator 150 provides signal Z (mentioned above). There is no need to synchronize signal Z with signal $X_1$. Preferably, $F_Z$ is higher than $F_1$, and $F_Z$ is also higher than the average $F'_2$ of $F_2$, that is:

$$F_Z > F_1 \qquad (20)$$

$$F_Z > F'_2 \qquad (22)$$

A preferred value for $F_Z$ is, for example, the rated frequency $F_{Z\ RATED} = 160$ MHz ($T_Z = 6.25$ ns). Due to tolerances in manufacturing generator 100, $F_Z$ is allowed to vary in a predetermined operating range (i.e. $F_{Z\ MIN} \ldots F_{Z\ MAX}$) that is larger than the frequency range of signal Y (i.e., $F_{Y\ MIN} \ldots F_{Y\ MAX}$), but that is smaller than the frequency $F_Y$, that is:

$$|F_{Z\ MAX} - F_{Z\ MIN}| > |F_{Y\ MAX} - F_{Y\ MIN}| \qquad (24)$$

Preferably, $F_Z$ varies by plus/minus 10 percent (e.g., 144 MHz . . . 176 MHz). However, other ranges can also be used (e.g., 85 MHz . . . 250 MHz).

Oscillator 150 is, preferably, implemented on the chip without the use of frequency stabilizing quartz components. Oscillator 150 is preferably, implemented as a frequency controlled oscillator VCO that receives a control voltage $V_C$ from DAC 151. In other words, oscillator 150 is a digitally controlled oscillator.

Oscillator 150 exhibits a frequency drift that is a function of the temperature and control voltage $V_C$.

Alternatively, oscillator 150 is implemented as a delay ring oscillator with a loop of delay elements (example explained in U.S. Pat. No. 5,832,048).

Feedback unit 160 converts signal $X_2$ into feedback clock signal $X_3$, for example, by division with factor $M_1$. Signal $X_3$ has a frequency that is about frequency $F_1$.

Division can be accomplished, for example, by changing the logical state (causing transitions) of $X_3$ every $M_1$ periods of $X_2$. Preferably, feedback unit 160 is implemented by a counter to $M_1$.

Decimation is well known in the art, and described, for example, in "Crochiere, R. E. and Rabiner, L. R.: '"Interpolation and Decimation of Digital Signals—A Tutorial Review', Proceedings of the IEEE, vol. 69, No.3, March 1981".

Detector 120 calculates the phase difference between signal $X_1$ (frequency $F_1$) and signal $X_3$ (also about frequency $F_1$, cf. feedback loop via unit 160), preferably, with an accuracy of a single period $T_Z$ and provides numeric representation "dK" of this phase difference. Preferably, detector 120 is implemented as an up-and-down counter. Details are explained in connection with FIGS. 4 and 8.

Filter 130 samples the numeric representation "dK" with a sampling frequency $F_S$ that is, preferably, higher than $F_1$ and thereby low-pass filters "dK" to further numeric representation "K". Details for the operation of filter 130 are also explained in connection with FIGS. 9–10.

Filter 130 provides stability in the first control loop (120, 130, 140, 160) by preventing positive feedback.

Divider 140 provides signals $X_2$. As explained with more detail below, the period $T_2(n)$ of $X_2$ is variable and depends on K and on Z (cf. $T_2(n)$ in FIG. 11).

Figure 4:
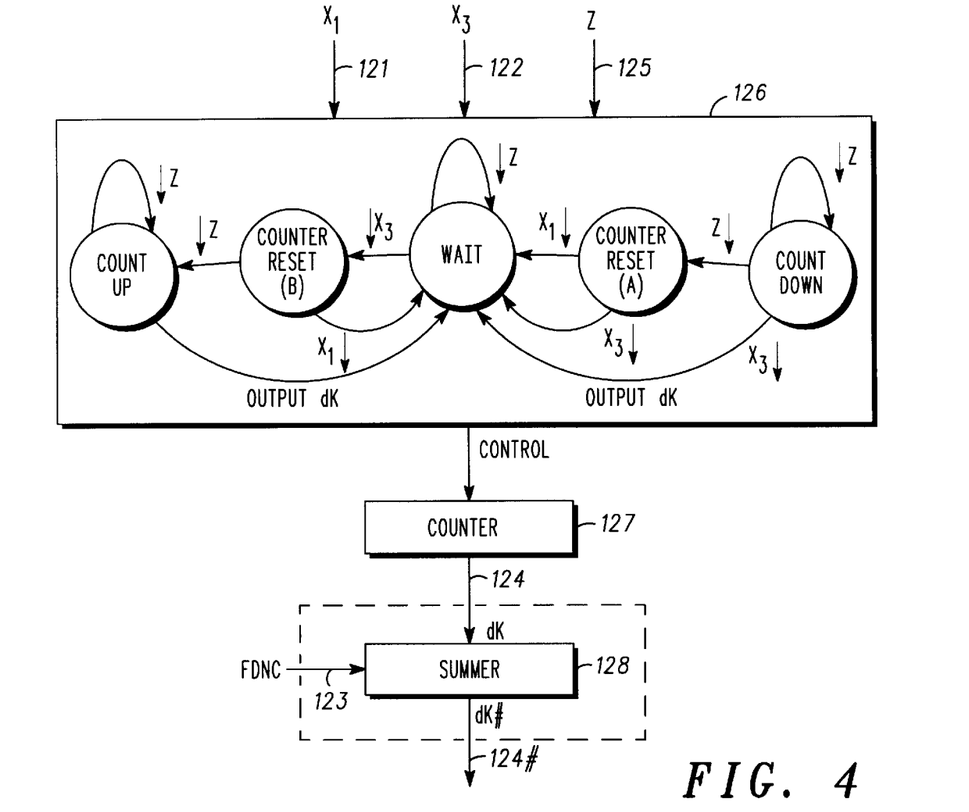
FIG. 4 illustrates a simplified block diagram of a detector in the multiplier of FIG. 3.

FIG. 4 illustrates a simplified block diagram of detector 120 in multiplier 110 of FIG. 3. Detector 120 comprises state-machine 126, counter 127, and—optionally—adder 128. State machine 126 receives signal $X_1$ at input 121, signal $X_3$ at input 122, as well as signal Z at input 125, and forwards control signals (collectively labeled "CONTROL") to counter 127. Counter 127 provides signal dK at output 124, hence dK is an integer.

Optionally, as indicated by the dashed frame, adder adds signal FDNC (cf. FIG. 3) at input 123 to dK, resulting in dK# at output 124# With FDNC being a real number, dK# is also a real number.

The following explanation considers dK as integer; persons of skill in the art can apply the mentioned fine adjusting by using dK# instead (output 124# coupled to input 123 of filter 130, second control loop).

In state machine 126, circles illustrate the following states: WAIT, COUNTER RESET (A), COUNTER RESET (B), COUNT DOWN, and COUNT UP. Unidirectional arrows between the states indicate state transitions that are triggered, as in the example of FIG. 4, by falling edges (symbols ↓) of signals $X_1$, $X_3$ and Z that occur at any time point. The WAIT state has 3 departing arrows that correspond to each signal $X_1$, $X_3$ and Z. The other states have 2 departing arrows only so that they remain unchanged even for the falling edge of the "non-arrow" signal.

If a falling edge triggers a state transition, i.e. when an arrow goes to a circle, state machine 126 causes counter 127 either to reset dK to zero ("RESET"); to increment dK by 1 ("COUNT UP"); to decrement dK by 1 ("COUNT DOWN"); or to output dK to adder 128 (that substantially simultaneously forwards dK to output 124).

Preferably, when dK has reached its maximum value (i.e. dK=$dK_{MAX}$) and state machine 126 issues COUNT UP, then dK remains unchanged at $dK_{MAX}$. Similarly, when dK has reached its minimum value (i.e. dK=$dK_{MIN}$) and state machine 126 issues COUNT DOWN, then dK remains unchanged at $dK_{MIN}$.

Without departing from the invention, persons of skill in the art can modify state machine 126, for example, by making it respond to rising edges.

Figure 5:
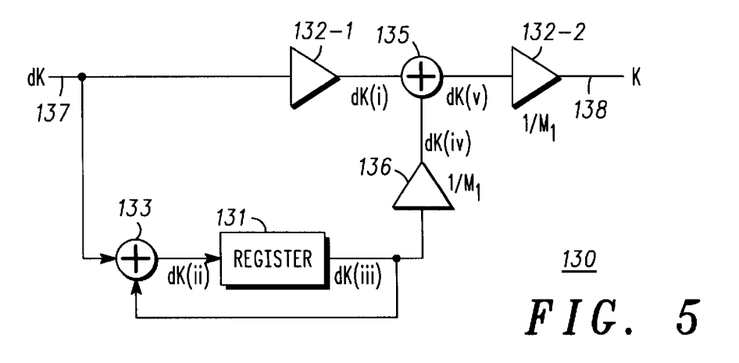
FIG. 5 illustrates a simplified block diagram of a digital filter in the multiplier of FIG. 3.

FIG. 5 illustrates a simplified block diagram of digital filter 130 in multiplier 110 of FIG. 3. Digital filter 130 comprises multiply unit 132, adder units 133 and 135, register 131, and divide unit 136. Filter 130 receives dK at input 137 (cf. FIG. 3) and provides K at output 138 (cf. FIG. 3).

Multiply unit 132-1 digitally multiplies representation dK to dK', for example, by a multiplication factor of 1.5. Adder unit 133 digitally adds dK from input 137 and dK(iii) from register 131 to dK(i); register 131 delays dK(ii), preferably, by a single period $1/F_2$ to dK(iii); divide unit 136 divides dK(iii) to dK(iv), preferably, by dividing with $M_1$; and adder unit 135 adds dK(i) and dK(iv) to dK(v); and multiply unit 132-2 digitally multiplies dK(v), preferably, by $1/M_1$, to K at output 138. Digitally multiplying signals is well known in the art.

Since the multiplication factor in units 132-1 and 132-2 is a real number, dK(i), dK(iv), dK(v) as well as K are real numbers too, each having an integer portion and a fractional portion. The integer portion represents a positive or negative numeric integer value; and the fractional portion represents a numeric value between 0 and +1. Preferably, K is positive.

For simplicity, the figures represent the signal flow by single lines; persons of skill in the art can implement the connections, for example, in parallel by separate bit lines. Conveniently, the real portions are transmitted by bit lines for $2^0$, $2^1$, $2^2$ and so on; and similarly, the fractional portions are transmitted by bit lines for $2^{-1}$, $2^{-2}$ and so on. For convenience of further explanation, the term "most significant bits" (MSB) is used for the integer portion; and the term "least significant bits" (LSB) stands for the fractional portion.

Figure 6:
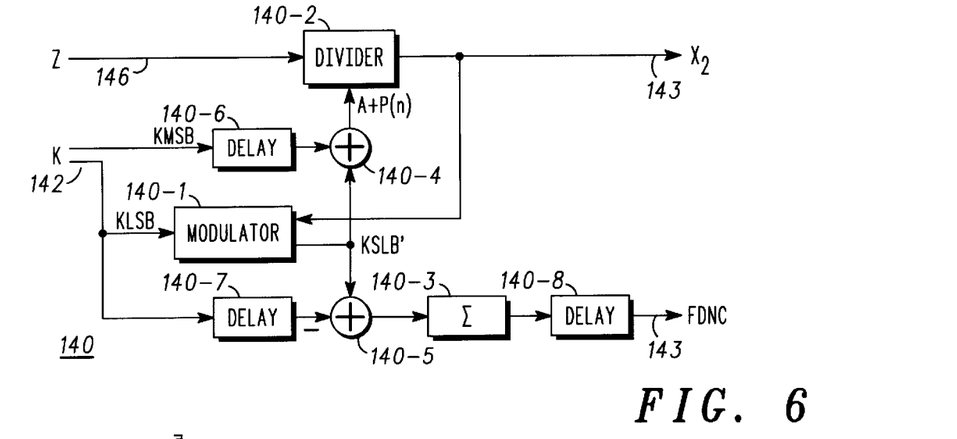
FIG. 6 illustrates a simplified block diagram of a digital fractional divider in the multiplier of FIG. 3.

FIG. 6 illustrates a simplified block diagram of digital fractional divider 140 in multiplier 110 of FIG. 3. Divider 140 receives representation K at input 142 from filter 130, receives signal Z at input 146 from oscillator 150, provides signal $X_2$ at output 145 (cf. FIG. 3), and—optionally—provides FDNC at output 143. Divider 140 comprises delta-sigma modulator 140-1, controlled frequency divider 140-2, integrator 140-3, and adders 140-4 and 140-5. Coming from input 142, the bits of K split into most significant bits (KMSB) and least significant bits (KLSB), cf. the explanation of FIG. 5 above. Modulator 140-1 modulates KLSB to KLSB'; adder 140-4 forwards the sum of KLSB40 and KMSB to divider 140-2; under control of Z, divider 140-2 provides $X_2$; $X_2$ is fed back to modulator 140-1; and—optionally—adder 140-5 forwards the difference between KLSB and KLSB' to integrator 140-3 for further integration to FDNC.

Since some components (like modulator 140-1) introduce a delay, additional delay stages are convenient to ensure simultaneous signal arrival at adders 140-4 and 140-5, has well as at output 143. Illustrated are delay stage 140-6 (between input 142 and adder 140-4), delay stage 140-7 (between input 142 and adder 140-5), and delay stage 140-8 (between integrator 140-3 and output 143).

(c)

FIG. 7 illustrates a simplified spectrum of signal $X_2$ in generator 100 of FIG. 2 and the transfer function of PLL circuit 180. The abscissa axis shows $F_2$ in MHz. Graph 1 shows the power spectrum density, and graph 2 shows the transfer function. The transfer function is substantially inverse to the spectrum, so that low frequency components of $X_2$ are prioritized over high frequency components. In other words, while PLL circuit 180 passes the "low" frequency components at $F_2$, PLL circuit 180 filters out the unwanted "high" frequency components.

Assuming sampling with 16 MHz, the spectrum is shown up to 8 MHz only (Nyquist criterium), wherein higher frequency components are not considered here.

Figure 8:
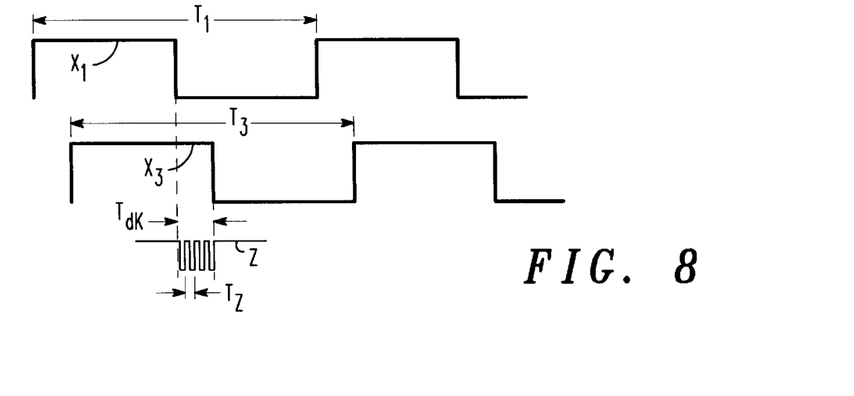
FIG. 8 illustrates a simplified signal diagram of an input signal as well as intermediate signals in the multiplier of FIG. 3.

FIG. 8 illustrates a simplified signal diagram of signals $X_1$, $X_3$ and Z in multiplier 110 of FIG. 3. Also, FIG. 8 indicates how detector 120 derives signal dK. As mentioned above, detector 120 calculates the phase difference between signal $X_1$ and signal $X_3$ with an accuracy of plus/minus a single period $T_Z$ of signal Z.

At output 124, detector 120 provides dK as a numeric representation of the time $T_{dK}$ between consecutive falling edges of $X_1$ and $X_3$ counted by periods $T_Z$, that is:

$$dK = T_{dK}/T_Z \tag{28}$$

Preferably, the sign of dK also indicates which signal leads: dK is positive when the falling edge of $X_1$ comes earlier than the falling edge of $X_3$ as in FIG. 8, and dK is negative otherwise. Values of dK are, preferably, the following range:

$$dK_{MIN} \leq dK \leq dK_{MAX} \quad (30)$$

$$-T_2*T_Z*0.5 \leq dK \leq +T_2*T_Z*0.5 \quad (32)$$

$$-250 \leq dK \leq +250 \text{ (example)} \quad (34)$$

However, in most cases, the falling edges occur at short intervals, so that dK is in the range ±32.

Since detector 120 determines dK based on a period $T_Z$, the value of dK is linearly related to frequency $F_Z$. In other words, suppose Td remains constant, dK increases if oscillator 150 speeds up and dK decreases if oscillator 150 slows down. In other words, dK is proportional to the frequency ratio between $F_Z$ of signal Z and $F_1$ of signal $X_1$, and proportional to the period ratio between $T_1$ and $T_Z$, that is:

$$dK = \text{factor} * F_Z/F_1 \quad (36)$$

$$dK = \text{factor} * T_1/T_Z \quad (38)$$

with "factor" being a proportional factor introduced for convenience of explanation.

Figure 9:
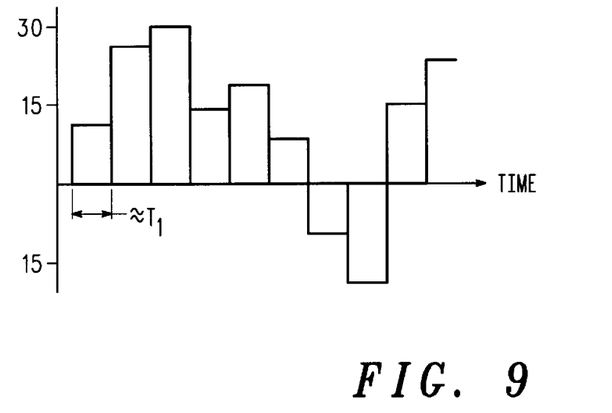
FIG. 9 illustrates a simplified signal diagram of an intermediate signal in the multiplier of FIG. 3.

FIG. 9 illustrates a simplified signal diagram of signal dK in multiplier 110 of FIG. 3. Values of dK are shown be vertical lines. Since falling edges in each signal $X_1$ and $X_3$ occur every $T_{1\sim T3}$, a new value of dK becomes available every $T_1$ and remains constant during that interval (horizontal lines).

Figure 10:
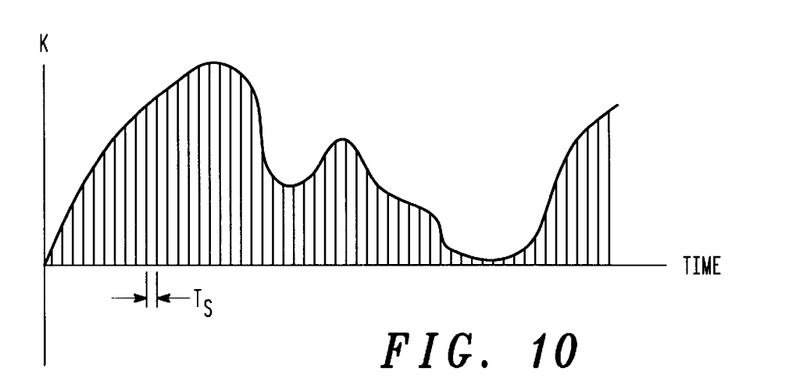
FIG. 10 illustrates a simplified signal diagram of an intermediate signal in the multiplier of FIG. 3.

FIG. 10 illustrates a simplified signal diagram of intermediate signal K provided by filter 130 in multiplier 110 of FIG. 4. K represents a real number (floating point). Compared to dK, the signal K appears less jumping and more smoothed.

Compared to dK, K changes at the above mentioned shorter sampling periods, that is:

$$T_S < T_1 \quad (40)$$

This is conveniently achieved by sampling dK by filter 130 with signal Z or with signal $X_2$.

$$T_S < T_Z \quad (42)$$

$$T_S < T_2 \quad (44)$$

Similar as dK, K is proportional to the frequency and period ratios mentioned above. In other words, K gives also a qualitative representation of the frequency of signal Z.

Figure 11:
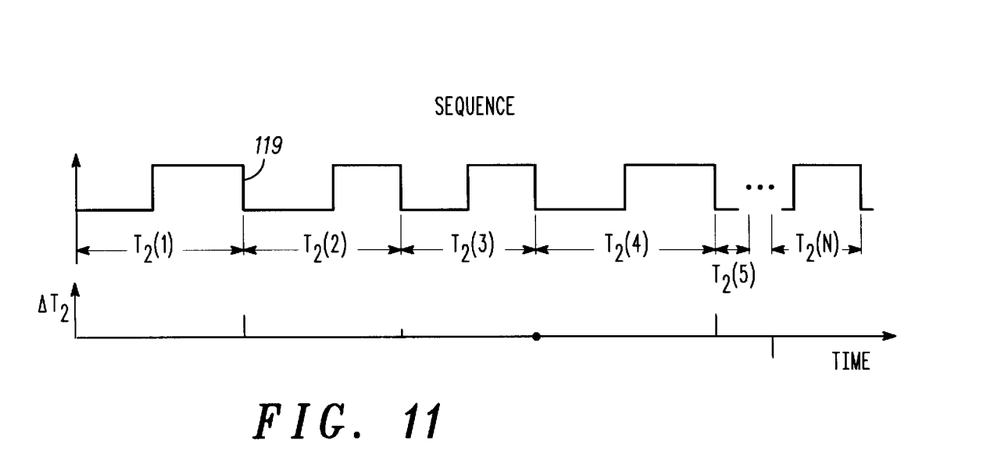
FIG. 11 illustrates a simplified signal diagram of an intermediate signal provided by the multiplier of FIG. 3.

FIG. 11 illustrates a simplified signal diagram of signal $X_2$ provided by multiplier 110 of FIG. 4. Signal $X_2$ is illustrated with consecutive periods between falling edges 119:

$$T_2(1), T_2(2), T_2(n) \ldots T_2(N) \quad (46)$$

As mentioned above, period $T_2(n)$ varies in duration. Each period $T_2(n)$ is allowed to differ from its predecessor, that is:

$$T_2(n-1) \neq T_2(n) \quad (48)$$

In other words, the actual period $T_2(n)$ differs from the average period $T'_2$ (i.e., $1/F'_2$) by a predetermined offset $\Delta T_2(n)$ $$T_2(n) = T'_2 + \Delta T_2(n) \quad (50)$$

also called "jitter", indicated below for each falling edge 119; $\Delta T_2(n)$ is either zero ($T_2(n)$ substantially equal to $T'_2$), positive ($T_2(n)$ longer than $T'_2$), or negative ($T_2(n)$ shorter than $T'_2$).

The above mentioned average $T'_2$ of $T_2(n)$ is calculated over N periods as follows:

$$T'_2 = \frac{1}{N} \sum_{n=1}^{N} T_2(n) \quad (52)$$

Preferably, N is larger than the number of periods $T_2(n)$ that fit into a single period $T_1$. In other words, N is larger than $M_1$. As mentioned above, $T_2(n)$ is a multiple of $T_Z$, that is:

$$T_2(n) = T_Z * [A + P(n)] \quad (54)$$

Both A and P(n) are integers; A is a positive constant, and P(n) is a positive or negative offset variable, that is:

$$P(n) = 0, \pm 1, \pm 2 \ldots \pm P_{MAX} \quad (56)$$

Preferably, the absolute value of $P_{MAX}$ is smaller than or equal to the absolute value of A, that is:

$$|P_{MAX}| \leq |A| \quad (58)$$

In the example, $T_2(1)$ is longer than $T'_2$ (i.e., $\Delta T_2(1) = +T_Z$); $T_2(2)$ is substantially equal to $T'_2$ (i.e., $\Delta T_2(2) = 0$); $T_2(3)$ is shorter than $T'_2$ (i.e., $\Delta T_2(1) = -T_Z$), thus giving an offset sequence starting with P(1)=+1, P(2)=0, and P(3)=−1.

Using the offset sequence P(1) to P(N), the previous equations are re-written as follows:

$$T'_2 = T_Z * \left[ A + \frac{1}{N} \sum_{n=1}^{N} P(n) \right] \quad (60)$$

$$T'_2 = T_Z * [A + P'] \quad (62)$$

Preferably, the offset sequence P(1) to P(N) is predetermined and depends on K. The average P' of the sequence as well as $T_Z$ determine T'. Changes of $T_Z$ are allowed but the influence of such changes is compensated by P'.

In operation, divider 140 provides signal $X_2$, for example, by repeating the following event sequence: (i) at the beginning of each period $T_2$ (n), divider 140 outputs falling edge 119 of $X_2$ (as mentioned above, falling edges can also be used); (ii) also at the beginning of $T_2(n)$, divider 140 starts to count A+P(n) periods of $T_Z$ ; (iii) divider 140 output a rising edge of $X_2$ (e.g., after half of A+P(n) periods); and (iv) after A+P(n) periods $T_Z$, divider 140 outputs falling edge 119 again (starting $T_2(n+1)$). Persons of skill in the art are able to provide the P(n) sequence, for example, by a look-up table; providing a counter is well known too, so that table and counter are not illustrated. Using a sigma-delta modulator for providing the P(n) sequence is also convenient. Such a sigma-delta modulator can relate KLSB to P'.

In the example, to achieve the above mentioned $F_2$=16 MHz and $T_2$=62.5 ns for $X_2$, for various frequencies $F_Z$ of signal Z, A is selected as A=10; the following values for P' are convenient: P'=−1 for $F_Z$=144 MHz, P'=−0.5 for $F_Z$=152 MHz, P'=0 for $F_Z$=160 MHz, P'=+0.5 for $F_Z$=168 MHz, and P'=+1 for $F_Z$=176 MHz.

While P' depends on K; the sequence of P(n) is distributed by quasi random, provided that the average P' reaches the required value. If K changes, P' changes too; if K remains unchanged, and P' remains unchanged. This random distribution avoids noise at predetermined frequencies in the spectrum of $X_2$ and hence also in Y. It is an advantage of the present invention that generator 100 is substantially stable after about 10 periods $T_1$ of "low frequency" signal $X_1$. Compared to the prior art (cf. FIG. 1), that is an improvement by the factor 100.

(d)

Figure 12:
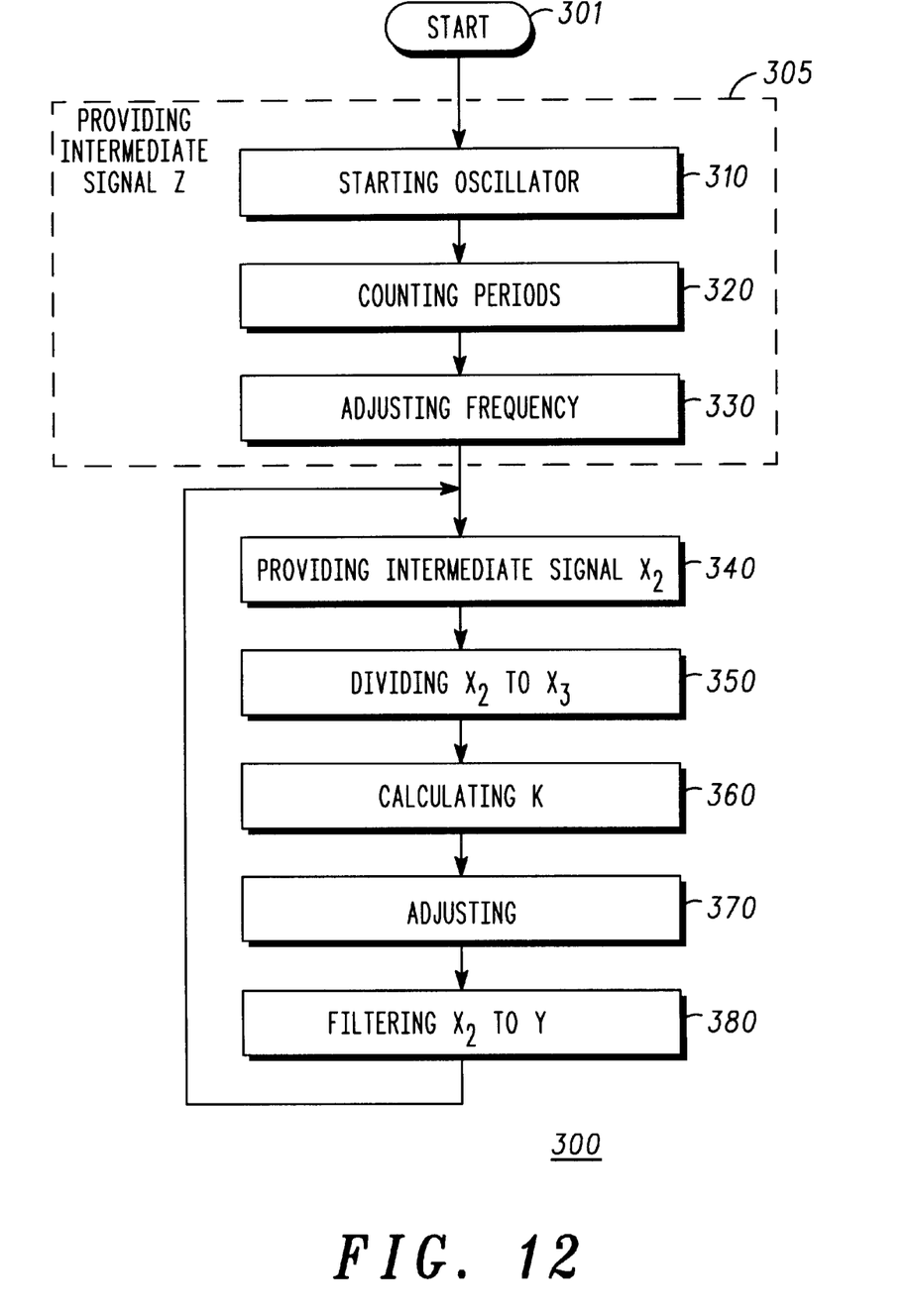
FIG. 12 illustrates a simplified flow chart diagram of a method to operate the multiplier of FIG. 3.

FIG. 12 illustrates a simplified flow chart diagram of method 300 to operate multiplier 110 of FIG. 2. At start 301, multiplier 110 is enabled by providing power signal $X_1$ to generator 100. As mentioned above, the stabilized time base of period $T_1$ of signal $X_1$ is available to multiplier 110 at substantially all the time.

The following steps 310, 320 and 330 are considered as calibration step 305 (dashed frame) of oscillator 150, preferably, executed by calibration unit 163.

In a first time frame, i.e. in step starting oscillator 310, oscillator 150 provides signal Z with an increasing frequency $F_Z$ until $F_Z$ reaches a predetermined minimum frequency $F_{Z\ MIN}$ that allows detector 120 to operate properly. For example, $F_{Z\ MIN}$ is half the rated frequency $F_{Z\ RATED}$, that is:

$$F_{Z\ MIN} = F_{Z\ RATED}/2 \quad (64)$$

$$F_{Z\ MIN} = 80 \text{ MHz (example)} \quad (66)$$

In a second time frame, i.e. in step counting periods 320, calibration unit 163 counts periods $T_Z$, for example, within a single period $T_1$ of signal $X_1$ and thereby measures the frequency $F_Z$. This is possible, because period $T_1$ is known; counting over more than one periods is also possible. During the operation of generator 100, frequency $F_Z$ can be measured at substantially any time, it is convenient to measure from time to time only.

In a third time frame, i.e., adjusting frequency 330, $F_Z$ is altered such that $F_Z$ reaches a predetermined rated value in the predetermined operation range $F_{Z\ MIN} \ldots F_{Z\ MAX}$. Conveniently, calibration unit 163 instructs DAC 151 to alter control voltage $V_C$ until signal Z reaches the desired frequency. Preferably, calibration unit 163 uses a translation table having separate values for $V_C$ assigned to separate frequency values.

Performing steps 310, 320 and 330 as explained here is convenient, but not essential for the present invention. Persons of skill in the art are able to start and calibrate oscillator 150 otherwise, such as, for example, as explained in U.S. Pat. No. 5,774,006.

Having signal Z stabilized is the condition for the operation of divider 140. Leaving calibration 305, in the following, step 340 providing intermediate signal $X_2$, divider 140 provides signal $X_2$ as described above.

During operation of divider 140 (substantially simultaneously with step 340), feedback unit 160, detector 110 and filter 130 provides signal K that represents a predetermined relation between signal $X_2$, intermediate clock signal Z and input reference clock signal $X_1$. Further, during operation, the filter coefficients of filter 130 can be adjusted (feedback loop).

In other words, method 300 to derive an output clock signal Y from input reference clock signal $X_1$ comprises the following steps:

generating 305 intermediate clock signal Z;

providing 340 intermediate clock signal $X_2$ by counting periods $T_Z$ of intermediate clock signal z wherein the number A+P(n) of periods of intermediate clock signal Z in intermediate clock signal $X_2$ varies and wherein the spectrum of intermediate signal $X_2$ is being shaped;

dividing 350 intermediate clock signal $X_2$ to feedback clock signal $X_3$ at substantially the same frequency as input reference clock signal $X_1$;

calculating 360 numeric representation K of the phase difference between input reference clock signal $X_1$ and feedback clock signal $X_3$ by counting periods of intermediate clock signal Z;

using numeric representation K to adjust 370 the number of periods of intermediate clock signal Z in intermediate clock signal $X_2$; and filtering 380 intermediate clock signal $X_2$ to output signal Y with a transfer function that is inverse to the spectrum.

While the invention has been described in terms of particular structures, devices and methods, those of skill in the art will understand based on the description herein that it is not limited merely to such examples and that the full scope of the invention is properly determined by the claims that follow.

What is claimed is:

1. A signal generator that receives an input clock signal at a first frequency and derives an output clock signal at a second frequency, said second frequency being higher than said first frequency, said signal generator comprising:

an arrangement using a first intermediate clock signal, said arrangement receiving said input clock signal and providing a second intermediate clock signal by selectively providing transitions of said second intermediate clock signal at time intervals that are determined by a variable number of periods of said first intermediate clock signal, said second intermediate clock signal having a third frequency with an average higher than said first frequency, said average of said third frequency being related to said first frequency by a first factor; and a phase-looked loop circuit that locks at said average of said third frequency and provides said output clock signal, said second frequency of said output signal being related to said average of said third frequency of said second intermediate clock signal by a second factor.

2. The signal generator of claim 1 wherein said arrangement comprises a local oscillator that provides said first intermediate clock signal at a fourth frequency higher than said first frequency.

3. The signal generator of claim 2, wherein said fourth frequency is lower than said average of said third frequency.

4. The signal generator of claim 1, wherein said arrangement further comprises:

a phase detector to determine a first representation of the frequency ratio between a fourth frequency of said first intermediate clock signal and said first frequency of said input clock signal;

a filter to filter said first representation to a second representation; and a divider that provides said transitions of said second intermediate signal depending on said second representation.

5. The signal generator of claim 4, wherein said divider provides said transitions of said second intermediate signals such that said variable number of periods of said first intermediate clock signal, over a period sequence with a number of consecutive periods of said second intermediate clock signal, the average of said variable number being a sum of a first number that is integer and a second number that is real.

6. The signal generator of claim 5, wherein said number of consecutive periods is larger than the frequency ratio between said fourth frequency of said first intermediate clock signal and said first frequency of said input clock signal.

7. The signal generator of claim 4, wherein said first representation is available at time intervals that have substantially equal duration as said period of said input signal.

8. The signal generator of claim 7, wherein said filter samples said first representation at a sampling frequency that is higher than said first frequency.

9. The signal generator of claim 8, wherein said sampling frequency is substantially equal to the frequency of said first intermediate signal.

10. The signal generator of claim 9, wherein said filter samples said first representation with said first intermediate clock signal.

11. The signal generator of claim 4, wherein a feedback unit derives a feedback clock signal from said second intermediate clock signal by counting to said first factor.

12. The signal generator of claim 11, wherein said phase detector determines said first representation by counting periods of said first intermediate signal that occur between predetermined transitions of said input signal and said feedback clock signal.

13. The signal generator of claim 4, wherein said first representation and said second representation are linearly related to the frequency of said first intermediate clock signal.

14. The signal generator of claim 1, wherein said first factor is programmable.

15. The signal generator of claim 1, wherein said first factor is a power-to-2 integer.

16. The signal generator of claim 15, wherein said first factor is selected from the set of 256, 512, and 1024.

17. A method to derive an output clock signal from an input reference clock signal, said method comprising the following steps:

generating a first intermediate clock signal;

providing a second intermediate clock signal by counting periods of said first intermediate clock signal wherein the number of periods of said first intermediate clock signal in said second intermediate clock signal varies and wherein the spectrum of said second intermediate clock signal is being shaped;

decimating said second intermediate clock signal to a feedback clock signal at substantially the same frequency as said input reference clock signal;

calculating a numeric representation of the phase difference between said input reference clock signal and said feedback clock signal by counting periods of said first intermediate clock signal;

using said numeric representation to adjust said number of periods of said first intermediate clock signal in said second intermediate clock signal; and filtering said second intermediate clock signal to said output signal with a transfer function that is inverse to said spectrum.

18. The method of claim 17, wherein the number of periods of said intermediate clock signal in said intermediate signal varies by quasi random.

* * * * *